United States Patent
Margomenos et al.

(10) Patent No.: US 7,733,265 B2
(45) Date of Patent: Jun. 8, 2010

(54) THREE DIMENSIONAL INTEGRATED AUTOMOTIVE RADARS AND METHODS OF MANUFACTURING THE SAME

(75) Inventors: Alexandros Margomenos, Ann Arbor, MI (US); Serdar Hakki Yönak, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 12/098,283

(22) Filed: Apr. 4, 2008

(65) Prior Publication Data

US 2009/0251362 A1  Oct. 8, 2009

(51) Int. Cl.
*G01S 13/93* (2006.01)
*G01S 7/02* (2006.01)
*G01S 13/00* (2006.01)

(52) U.S. Cl. ............................ 342/70; 342/27; 342/175; 342/188; 342/195; 342/368; 343/700 R; 343/711; 343/700 MS; 343/872

(58) Field of Classification Search ............... 342/27, 342/28, 70–72, 82, 89–103, 118, 128–133, 342/175, 192–197, 59, 188, 361–377; 343/700 MS, 343/711–717, 872, 873, 700 R, 793, 810, 343/812, 815, 817, 818, 833–840; 701/300, 701/301
See application file for complete search history.

(56) References Cited

U.S. PATENT DOCUMENTS

| 3,686,596 A | 8/1972 | Albee |
| 4,494,083 A | 1/1985 | Josefsson et al. |
| 4,623,894 A | 11/1986 | Lee et al. |
| 4,786,913 A | 11/1988 | Barendregt et al. |
| 5,115,245 A * | 5/1992 | Wen et al. .................. 342/175 |
| 5,124,713 A | 6/1992 | Mayes et al. |
| 5,153,600 A | 10/1992 | Metzler et al. |
| 5,220,335 A | 6/1993 | Huang |
| 5,307,075 A | 4/1994 | Huynh |
| 5,376,902 A | 12/1994 | Bockelman et al. |
| 5,436,453 A | 7/1995 | Chang et al. |
| 5,485,167 A | 1/1996 | Wong et al. |

(Continued)

FOREIGN PATENT DOCUMENTS

CN  101145627  3/2008

(Continued)

OTHER PUBLICATIONS

K. Schuler et al., "Innovative Material Modulation for Multilayer LTCC Antenna Design at 76.5 GHz in Radar and Communication Applications"; Proceedings of the 33rd European Microwave Conference, Munich 2003; pp. 707-710; printed in the year 2003.*

(Continued)

*Primary Examiner*—Bernarr E Gregory
(74) *Attorney, Agent, or Firm*—Snell & Wilmer L.L.P.

(57) ABSTRACT

The invention is a low-cost, compact radar for adaptively forming beams and independently steering the beams to improve the noise and sensitivity of the radar. The radar includes a printed circuit board, a low-cost multi-layer organic substrate, and a three dimensional (3D) radio frequency (RF) front end that is flood mounted on the substrate.

21 Claims, 12 Drawing Sheets

U.S. PATENT DOCUMENTS

| | | | |
|---|---|---|---|
| 5,495,262 A | 2/1996 | Klebe | |
| 5,512,901 A * | 4/1996 | Chen et al. | 342/175 |
| 5,554,865 A | 9/1996 | Larson | |
| 5,561,405 A | 10/1996 | Hoffmeister et al. | |
| 5,583,511 A * | 12/1996 | Hulderman | 342/175 |
| 5,633,615 A | 5/1997 | Quan | |
| 5,767,009 A | 6/1998 | Yoshida et al. | |
| 5,815,112 A * | 9/1998 | Sasaki et al. | 342/70 |
| 5,821,625 A | 10/1998 | Yoshida et al. | |
| 5,877,726 A * | 3/1999 | Kudoh et al. | 343/700 MS |
| 5,886,671 A | 3/1999 | Riemer et al. | |
| 5,929,802 A | 7/1999 | Russell et al. | |
| 5,943,005 A * | 8/1999 | Tanizaki et al. | 342/175 |
| 5,952,971 A | 9/1999 | Strickland | |
| 5,994,766 A | 11/1999 | Shenoy et al. | |
| 5,999,092 A | 12/1999 | Smith et al. | |
| 6,008,750 A * | 12/1999 | Cottle et al. | 342/70 |
| 6,034,641 A * | 3/2000 | Kudoh et al. | 343/834 |
| 6,037,911 A | 3/2000 | Brankovic et al. | |
| 6,043,772 A | 3/2000 | Voigtlaender et al. | |
| 6,091,365 A | 7/2000 | Derneryd et al. | |
| 6,107,578 A | 8/2000 | Hashim | |
| 6,107,956 A | 8/2000 | Russell et al. | |
| 6,114,985 A | 9/2000 | Russell et al. | |
| 6,130,640 A * | 10/2000 | Uematsu et al. | 342/175 |
| 6,137,434 A * | 10/2000 | Tohya et al. | 342/70 |
| 6,191,740 B1 | 2/2001 | Kates et al. | |
| 6,232,849 B1 | 5/2001 | Flynn et al. | |
| 6,249,242 B1 * | 6/2001 | Sekine et al. | 342/70 |
| 6,278,400 B1 | 8/2001 | Cassen et al. | |
| 6,281,843 B1 | 8/2001 | Evtioushkine et al. | |
| 6,329,649 B1 | 12/2001 | Jack et al. | |
| 6,359,588 B1 | 3/2002 | Kuntzsch | |
| 6,388,206 B2 | 5/2002 | Dove et al. | |
| 6,452,549 B1 | 9/2002 | Lo | |
| 6,483,481 B1 | 11/2002 | Sievenpiper et al. | |
| 6,483,714 B1 | 11/2002 | Kabumoto et al. | |
| 6,501,415 B1 | 12/2002 | Viana et al. | |
| 6,577,269 B2 | 6/2003 | Woodington et al. | |
| 6,583,753 B1 | 6/2003 | Reed | |
| 6,628,230 B2 * | 9/2003 | Mikami et al. | 342/175 |
| 6,639,558 B2 | 10/2003 | Kellerman et al. | |
| 6,642,819 B1 | 11/2003 | Jain et al. | |
| 6,642,908 B2 | 11/2003 | Pleva et al. | |
| 6,657,518 B1 | 12/2003 | Weller et al. | |
| 6,683,510 B1 | 1/2004 | Padilla | |
| 6,686,867 B1 | 2/2004 | Lissel et al. | |
| 6,727,853 B2 * | 4/2004 | Sasada et al. | 343/700 MS |
| 6,784,828 B2 | 8/2004 | Delcheccolo et al. | |
| 6,794,961 B2 | 9/2004 | Nagaishi et al. | |
| 6,795,021 B2 | 9/2004 | Ngai et al. | |
| 6,806,831 B2 | 10/2004 | Johansson et al. | |
| 6,828,556 B2 | 12/2004 | Pobanz et al. | |
| 6,842,140 B2 | 1/2005 | Killen et al. | |
| 6,853,329 B2 | 2/2005 | Shinoda et al. | |
| 6,864,831 B2 | 3/2005 | Woodington et al. | |
| 6,873,250 B2 * | 3/2005 | Viana et al. | 342/70 |
| 6,897,819 B2 * | 5/2005 | Henderson et al. | 343/713 |
| 6,930,639 B2 | 8/2005 | Bauregger et al. | |
| 6,940,547 B1 | 9/2005 | Mine | |
| 6,946,995 B2 | 9/2005 | Choi et al. | |
| 6,987,307 B2 | 1/2006 | White et al. | |
| 6,992,629 B2 | 1/2006 | Kerner et al. | |
| 7,009,551 B1 | 3/2006 | Sapletal | |
| 7,015,860 B2 | 3/2006 | Alsliety | |
| 7,019,697 B2 | 3/2006 | du Toit | |
| 7,030,712 B2 | 4/2006 | Brunette et al. | |
| 7,034,753 B1 | 4/2006 | Elsallal et al. | |
| 7,071,889 B2 | 7/2006 | McKinzie, III et al. | |
| 7,081,847 B2 | 7/2006 | Ziller et al. | |
| 7,098,842 B2 * | 8/2006 | Nakazawa et al. | 342/70 |
| 7,102,571 B2 | 9/2006 | McCarrick | |
| 7,106,264 B2 | 9/2006 | Lee et al. | |
| 7,109,922 B2 * | 9/2006 | Shmuel | 343/700 MS |
| 7,109,926 B2 | 9/2006 | du Toit | |
| 7,154,356 B2 | 12/2006 | Brunette et al. | |
| 7,177,549 B2 | 2/2007 | Matsushima et al. | |
| 7,193,562 B2 | 3/2007 | Shtrom et al. | |
| 7,215,284 B2 | 5/2007 | Collinson | |
| 7,187,334 B2 | 6/2007 | Franson et al. | |
| 7,236,130 B2 | 6/2007 | Voigtlaender | |
| 7,239,779 B2 | 7/2007 | Little | |
| 7,268,732 B2 * | 9/2007 | Gotzig et al. | 343/713 |
| 7,292,125 B2 | 11/2007 | Mansour et al. | |
| 7,307,581 B2 * | 12/2007 | Sasada | 342/70 |
| 7,331,723 B2 | 2/2008 | Yoon et al. | |
| 7,336,221 B2 * | 2/2008 | Matsuo et al. | 342/175 |
| 7,355,547 B2 * | 4/2008 | Nakazawa et al. | 342/70 |
| 7,358,497 B1 | 4/2008 | Boreman et al. | |
| 7,362,259 B2 * | 4/2008 | Gottwald | 342/70 |
| 7,388,279 B2 | 6/2008 | Fjelstad et al. | |
| 7,411,542 B2 * | 8/2008 | O'Boyle | 342/70 |
| 7,414,569 B2 * | 8/2008 | De Mersseman | 342/70 |
| 7,436,363 B1 | 10/2008 | Klein et al. | |
| 7,446,696 B2 * | 11/2008 | Kondo et al. | 342/175 |
| 7,456,790 B2 * | 11/2008 | Isono et al. | 343/700 MS |
| 7,463,122 B2 | 12/2008 | Kushta et al. | |
| 7,489,280 B2 | 2/2009 | Aminzadeh et al. | |
| 7,528,780 B2 | 5/2009 | Thiam et al. | |
| 7,603,097 B2 * | 10/2009 | Leblanc et al. | 342/70 |
| 2002/0047802 A1 | 4/2002 | Voipio | |
| 2002/0158305 A1 | 10/2002 | Dalmia et al. | |
| 2003/0016162 A1 * | 1/2003 | Sasada et al. | 342/70 |
| 2003/0034916 A1 | 2/2003 | Kwon et al. | |
| 2003/0036349 A1 | 2/2003 | Liu et al. | |
| 2004/0028888 A1 | 2/2004 | Lee et al. | |
| 2004/0075604 A1 * | 4/2004 | Nakazawa et al. | 342/70 |
| 2005/0109453 A1 | 5/2005 | Jacobson et al. | |
| 2005/0248418 A1 | 11/2005 | Govind et al. | |
| 2006/0044189 A1 | 3/2006 | Livingston et al. | |
| 2006/0152406 A1 * | 7/2006 | Leblanc et al. | 342/175 |
| 2006/0158378 A1 | 7/2006 | Pons et al. | |
| 2006/0250298 A1 * | 11/2006 | Nakazawa et al. | 342/70 |
| 2006/0267830 A1 | 11/2006 | O'Boyle | |
| 2006/0290564 A1 * | 12/2006 | Sasada et al. | 342/70 |
| 2007/0026567 A1 | 2/2007 | Beer et al. | |
| 2007/0085108 A1 | 4/2007 | White et al. | |
| 2007/0131452 A1 | 6/2007 | Gilliland | |
| 2007/0230149 A1 | 10/2007 | Bibee | |
| 2007/0279287 A1 | 12/2007 | Castaneda et al. | |
| 2007/0285314 A1 | 12/2007 | Mortazawi et al. | |
| 2008/0030416 A1 | 2/2008 | Lee et al. | |
| 2008/0048800 A1 | 2/2008 | Dutta | |
| 2008/0068270 A1 | 3/2008 | Thiam et al. | |
| 2008/0074338 A1 | 3/2008 | Vacanti | |
| 2008/0150821 A1 | 6/2008 | Koch et al. | |
| 2008/0169992 A1 | 7/2008 | Ortiz et al. | |
| 2009/0058731 A1 | 3/2009 | Geary et al. | |
| 2009/0066593 A1 | 3/2009 | Jared et al. | |
| 2009/0102723 A1 | 4/2009 | Mateychuk et al. | |

FOREIGN PATENT DOCUMENTS

| | | |
|---|---|---|
| EP | 1324423 | 7/2003 |
| KR | 777967 | 11/2007 |
| WO | WO 2007/149746 | 12/2007 |
| WO | WO 2008148569 | 12/2008 |

OTHER PUBLICATIONS

A European Low Cost MMIC Based Millimetre-Wave Radar Module for Automotive Applications, Mark Walden et al., 4 pages.

"Application of a Substrate-Lens Antenna Concept and SiGe Component Development for Cost-Efficient Automotive Radar", Denis Chouvaev et al., Sweedish National Testing and Research Institute, 34th European Microwave Conference, Amsterdam, 2004, pp. 1417-1420.

"Advanced RF Frontend Technology Using Micromachined SiGe", Information Society Technologies (IST Programme, 38 pages.

"Characteristic of the Coplanar Waveguide to Microstrip Right-Angled Transition"; Maeng-Youl Lee et al., 3 pgs.

"Design and Characterization of the EBG Waveguide-Based Interconnects"; Asanee Suntives et al.; *IEEE Transactions on Advanced Packaging*, vol. 30, No. 2; pp. 163-170; May 2007.

"Simulation and Performance of Passive Millimeter Wave Coplanar Waveguide Circuit Devices"; S.D. Gedney et al.; 1997 Wireless Communications Conference; pp. 27-31; May 1997.

"Three-Dimensional High-Frequency Distribution Networks—Part I: Optimization of CPW Discontinuities"; Thomas M. Weller; *IEEE Transactions on Microwave Theory and Techniques*, vol. 48, No. 10; pp. 1635-1642; Oct. 2000.

"Effects of Air-Bridges and Mitering on Coplanar Waveguide 90° Bends: Theory and Experiment"; A.A. Omar et al.; *1993 IEEE MTT-S Digest*; pp. 823-826; 1993.

"Design and Optimization of CPW Circuits Using EM-ANN Models for CPW Components"; Paul M. Watson et al.; *IEEE Transactions on Microwave Theory and Techniques*, vol. 45, No. 12; pp. 2515-2523; Dec. 1997.

"Combined Feed Network for a Shared-Aperture Dual-Band Dual-Polarized Array", Vetharatnam et al., IEEE Antennas and Wireless Propagation Letters, vol. 4, pp. 297-299, 2005.

"Shared-Aperture Dual Rand Dual-Polarized Microstrip Array", Pozar et al., IEEE Transactions on Antennas and Propagation, vol. 49, No. 2, pp. 150-157, Feb. 2001.

"Coupling Suppression in Microstrip Lines using a Bi-Periodically Perforated Ground Plane", IEEE Microwave and Wireless Components Letters, vol. 12, No. 5, pp. 169-171, May 2002.

U.S. Appl. No. 12/340,448, filed Dec. 19, 2008, Margomenos et al.

H. Iizuka et al., Millimeter-Wave Microstrip Array Antenna for Automotive Radars, IEICE Transactions for Communications, vol. E86-B, No. 9, pp. 2728-2738, Sep. 2003.

Margomenos et al., "Isolation in Three-Dimensional Integrated Circuits", *IEEE Transactions on Microwave Theory and Techniques*, vol. 51, issue 1, pp. 25-32, Jan. 2003.

Ponchak et al., "Characterization of the Coupling Between Adjacent Finite Ground Coplanar (FGC) waveguides", *Int. J. Microcircuits Electron. Packag.*, vol. 20, No. 4, pp. 587-592, Nov. 1997.

Ponchak et al., "Coupling Between Microstrip Lines With Finite Width Ground Plane Embedded in Thin-Film Circuits", *IEEE Transactions on Advanced Packaging*, vol. 28, No. 2, pp. 320-327, May 2005.

Ponchak et al., "The Use of Metal Filled Via Holes for Improving Isolation in LTCC RF and Wireless Multichip Packages", *IEEE Transactions on Advanced Packaging*, vol. 23, No. 1, Feb. 2000.

Papapolymerou et al., "Crosstalk Between Finite Ground Coplanar Waveguides Over Polyimide Layers for 3-D MMICs on Si Substrates", IEEE Transactions on Microwave Theory and Techniques, vol. 52, No. 4, pp. 1292-1301, Apr. 2004.

Mbairi et al., "On the Problem of Using Guard Traces for High Frequency Differential Lines Crosstalk Reduction", *IEEE Transactions on Components and Packaging Technologies*, vol. 30, No. 1, pp. 67-74, Mar. 2007.

\* cited by examiner ium plate 103.
THREE DIMENSIONAL INTEGRATED AUTOMOTIVE RADARS AND METHODS OF MANUFACTURING THE SAME

BACKGROUND

1. Field

The invention relates to low-cost three dimensional integrated automotive radars and methods of manufacturing the same. More particularly, the invention relates to a low-cost three dimensional multi-channel automotive radar where each channel can transmit and receive signals.

2. Background

Automotive radar systems are currently being provided in many luxury automobiles. Over the past few years, automotive radar systems have been used with intelligent cruise control systems to sense and adjust the automobile's speed depending on traffic conditions. Today, automotive radar systems are being used with active safety systems to monitor the surroundings of an automobile for collision avoidance. Current automotive radars are divided into long range (for adaptive cruise control and collision warning) and short range (for pre-crash, collision mitigation, parking aid, blind spot detection, etc.). Some automotive radar systems have been developed to operate at 24 GHz and 77 GHz. An example of an automotive radar system is shown in FIG. 1.

FIG. 1 is a cross-sectional view of a prior art radar 100. The radar 100 includes a first Teflon® substrate 101, a second Teflon® substrate 102 and an aluminum plate 103 positioned between the first Teflon® substrate 101 and the second Teflon® substrate 102. Teflon® is a registered trademark of E.I. du Pont de Nemours and Company that is used for polytetrafluoroethylene (PTFE). Therefore, the term Teflon® can be used interchangeably with the term PTFE in this disclosure. A transmit radio frequency integrated circuit (Tx RFIC) 105 and a receive radio frequency integrated circuit (Rx RFIC) 115 are attached to the first Teflon® substrate 101. The radar 100 includes a first low-temperature co-fired ceramic (LTCC) module 125 for the Tx RFIC 105 and a second LTCC module 130 for the Rx RFIC 115. The Tx RFIC 105 and the Rx RFIC 115 are designed for flip-chip mounting to the first Teflon® substrate 101. A separate transmit antenna 110 and a separate receive antenna 120 are attached to the second Teflon® substrate 102 and are connected to the first LTCC module 125 and the second LTCC module 130, respectively, using coaxial transmission lines 135 and 140 and microstrip transmission lines 145 and 150. As shown in FIG. 1, the coaxial transmission lines 135 and 140 pass through the aluminum plate 103.

Prior art radar systems have several drawbacks. For example, prior art radar systems are bulky and expensive, and use a metallic frame for packaging and support. In addition, prior art radar systems, such as the one shown in FIG. 1, require coaxial, microstrip, and waveguide connections between the antennas and the printed circuit board. The large number of connections and transitions (from the Tx/Rx RFIC to a wirebond, to a microstrip, to the waveguide/Coaxial TL, and finally to the antenna) increase the noise and deteriorate the sensitivity and range of the radar system. This is especially critical for the Receiver (Rx) function where the loss of interconnects between the antenna and the Rx RFIC dominate the overall noise figure of the radar 100 and determine its sensitivity.

Therefore, a need exists in the art for low-cost three dimensional integrated automotive radars with minimum number of connections and transitions between the chip and the antenna.

SUMMARY

The invention is a low-cost, compact radar that can adaptively form beams and independently steer beams to improve the functionality of the radar. Furthermore, by using a three-dimensional RF assembly technique, the necessary number of connections and transitions between the antennas and the chips can be minimized and therefore the noise and sensitivity of the radar is improved. The radar includes a printed circuit board, a low-cost multi-layer organic substrate, and a three dimensional (3D) radio frequency (RF) front end that is flood mounted on the substrate.

In one embodiment, an automotive radar comprises a printed circuit board having a digital signal processor mounted thereon and a multi-layer substrate mounted on the printed circuit board, the multi-layer substrate having a plurality of antennas and a transmit/receive module directly connected to the plurality of antennas, wherein the transmit/receive module receives signals from the digital signal processor to achieve adaptive beam control and beam steering of the plurality of antennas.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. In addition, the first digit of each reference number indicates the figure in which the element first appears.

Figure 1:
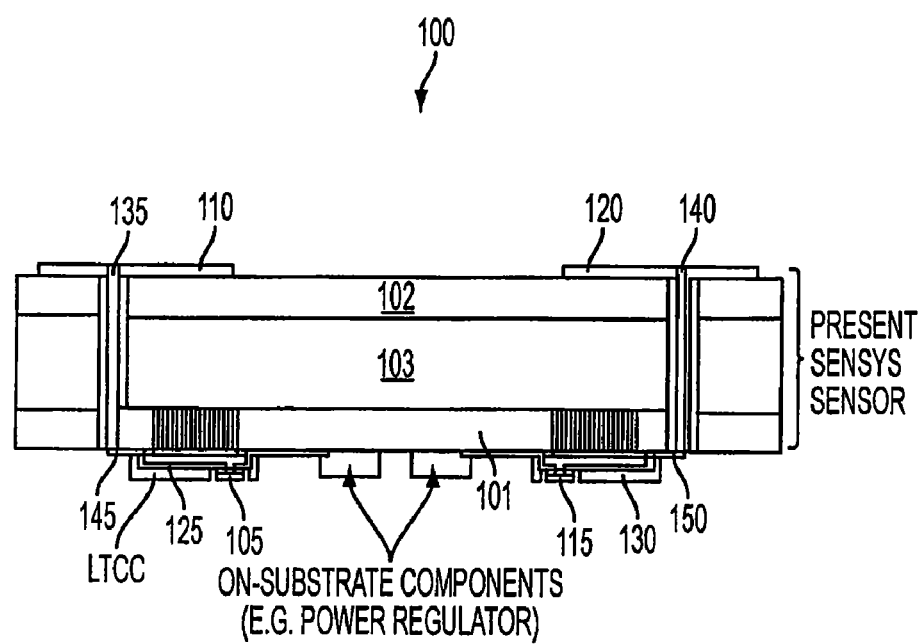
FIG. 1 is a cross-sectional view of a prior art radar.
Figure 2A:
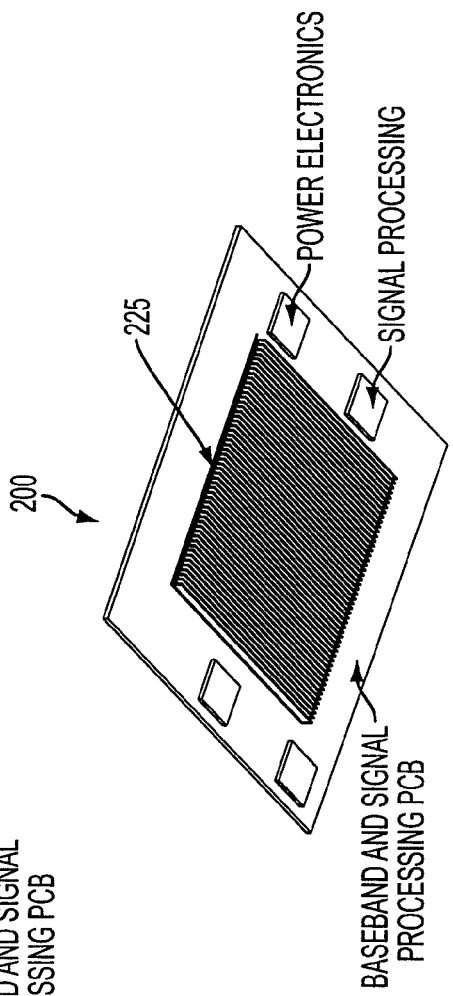
FIGS. 2A, 2B, and 2C are top perspective, bottom perspective, and side views, respectively, of a low-cost, compact radar that utilizes a three-dimensional integrated architecture in order to improve the noise and sensitivity of the radar and T/R chips or modules to achieve adaptive beam control and beam steering according to an embodiment of the invention.
Figure 2B:
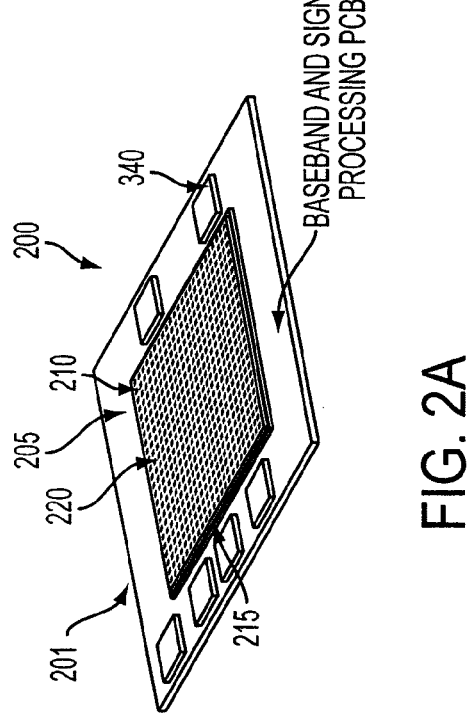
Figure 2C:
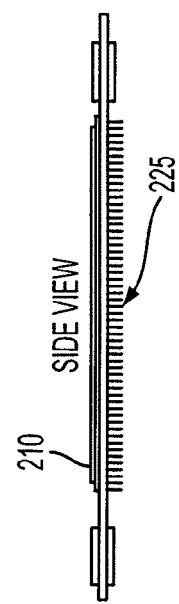
Figure 2D:
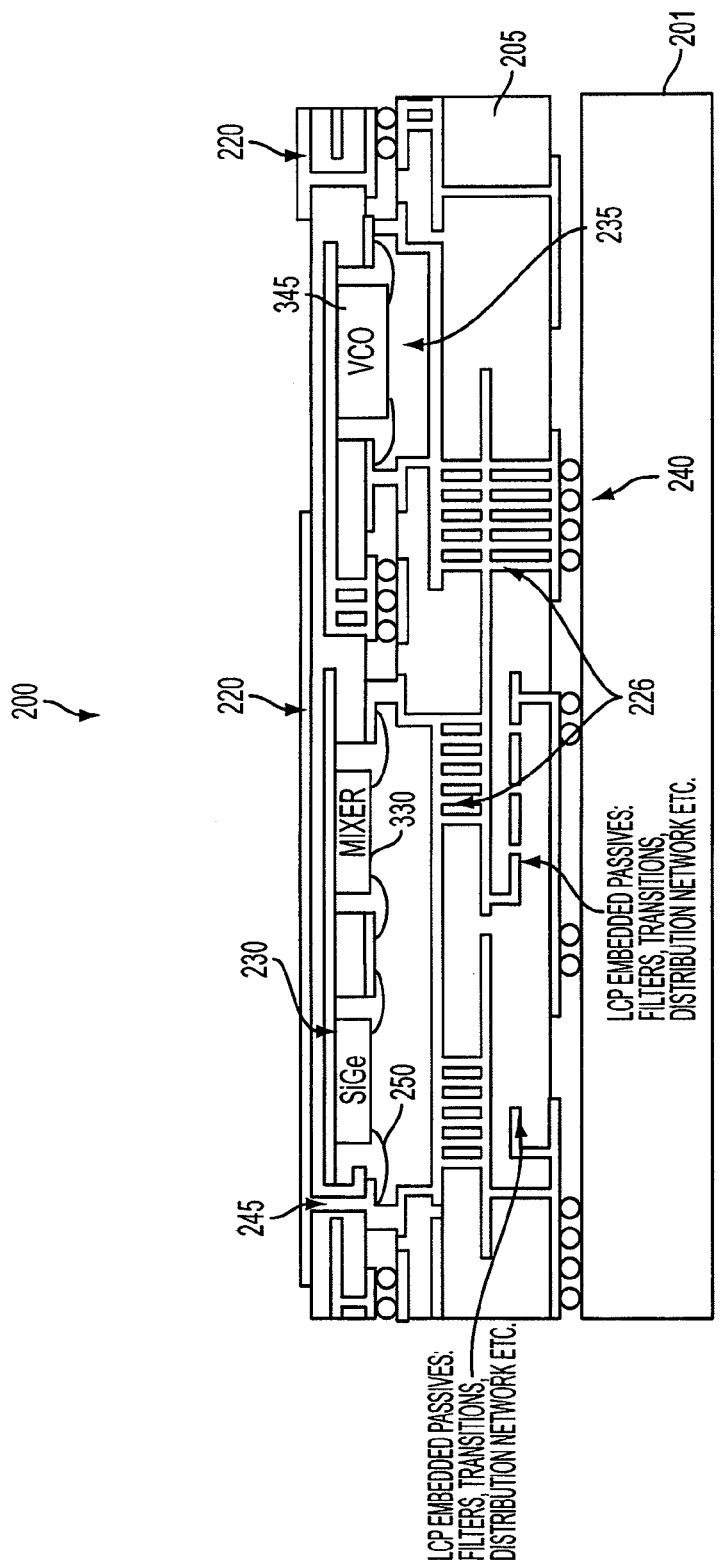
FIG. 2D is a cross-sectional view of a front end of the radar of FIGS. 2A, 2B, and 2C according to an embodiment of the invention.

FIGS. 2A, 2B, and 2C are top perspective, bottom perspective, and side views, respectively, of a low-cost, compact radar 200 that utilizes a three-dimensional integrated architecture in order to improve noise and sensitivity of the radar, and T/R chips 230 to achieve adaptive beam control and beam steering. The radar 200 includes a printed circuit board (PCB) 201, a low-cost multi-layer organic substrate 205, and a three dimensional (3D) radio frequency (RF) front end 210 that is flood mounted on the substrate 205. FIG. 2D is a cross-sectional view of the front end 210 of the radar 200. The substrate 205 can be any multi-layer substrate that exhibits low-loss signal propagation at, for example, 77 GHz, such as a liquid crystal polymer (LCP), a low temperature cofired ceramic (LTCC), a Parylene N dielectric, a polytetrafluoroethylene (PTFE) ceramic, a PTFE glass fiber material or any other material that can produce thin (2-4 mils) metallized layers which can be stacked to form multi-layer architectures. Parylene N is generically referred to as poly-para-xylylene. Therefore, the term Parylene N can be used interchangeably with the term poly-para-xylylene.

Figure 11:
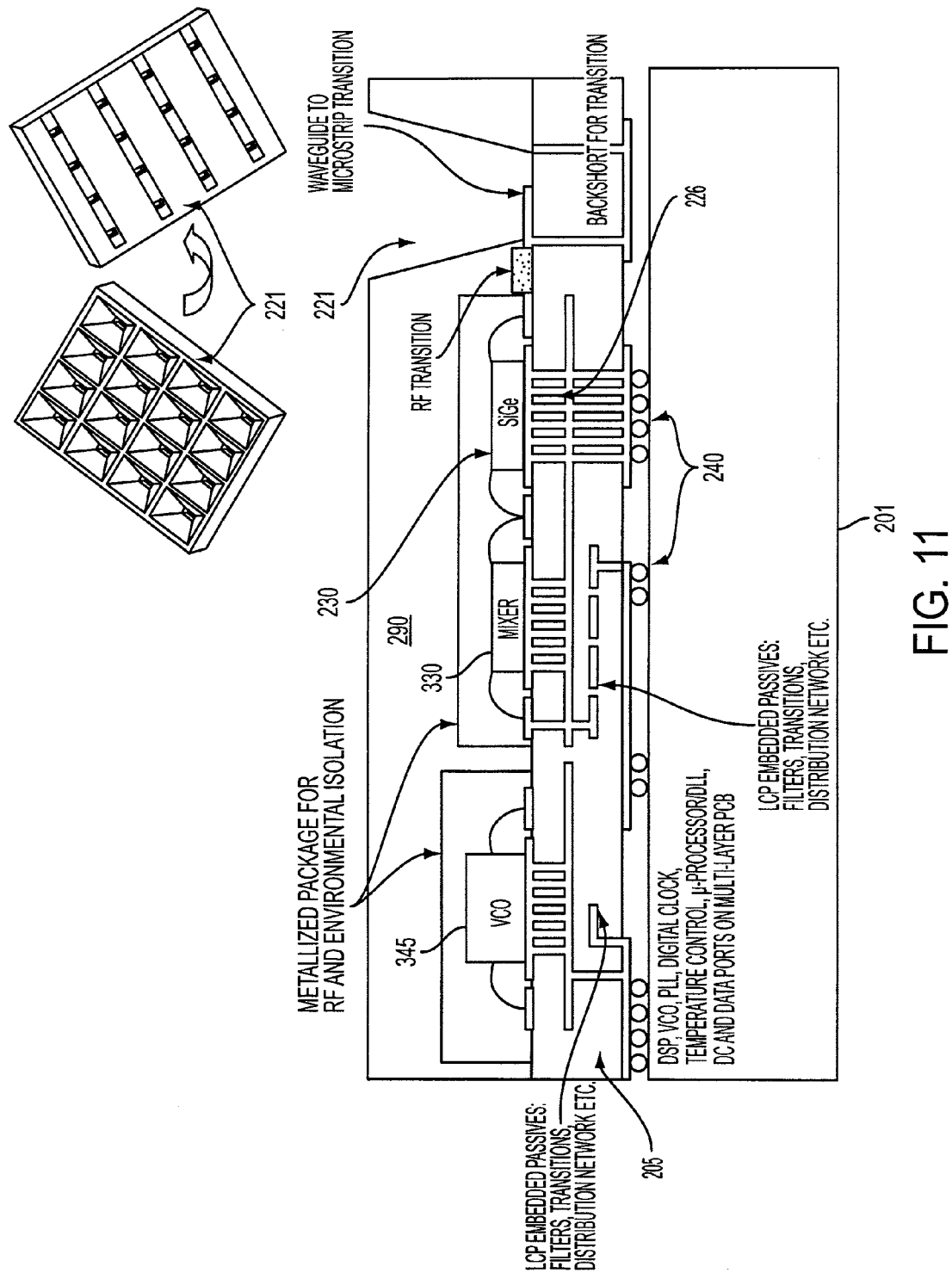
FIG. 11 is a cross-sectional view of a front end of a radar where the planar antenna array shown in FIG. 2D is replaced with a waveguide horn array fabricated on a low-cost metallized plastic according to another embodiment of the invention.

The radar 200 also includes a micromachined plastic 290, as shown in FIG. 11, (e.g., machined by injection molding or hot embossing) that is metallized using conventional thin film deposition (e.g., sputtering, plating, etc.). The LCP and the plastic are used as both an interposer material (e.g., a substrate upon which the different components can be mounted) and a package for protecting the radar 200 from environmental factors (e.g., humidity and dust) and electromagnetic crosstalk. The radar 200 has a size of about 8 cm×8 cm×1 cm, which is approximately 60% smaller than prior art radar systems. The radar 200 may be implemented using hardware, software, firmware, middleware, microcode, or any combination thereof. One or more elements can be rearranged and/or combined, and other radars can be used in place of the radar 200 while still maintaining the spirit and scope of the invention. Elements may be added to the radar 200 and removed from the radar 200 while still maintaining the spirit and scope of the invention.

A ball grid array 240 may be used as a transition between the PCB 201 and the front end 210 or a flood mount connection using wirebonds (FIG. 2A) can be used. The front end 210 includes an array of antennas 220 and RF components that are printed, mounted, and self-packaged on the substrate 205. The RF components control the radar operations, perform signal processing, and provide power. Wirebonds 215 may be used for connecting or interconnecting the digital, dc power, and low frequency signals from the front end 210 to the substrate 205. Good RF grounding and low thermal resistance is achieved by providing good connections between the front end 210 and the substrate 205.

A heat exchanger 225, which is used to cool the front end 210, is directly mounted to a backside of the front end 210. The heat exchanger 225 has a number of thermal vias 226 that can be placed under each T/R chip 230 on the PCB 201 in order to remove heat and transfer the heat to a heat exchange point on a backside of the PCB 201. The thermal vias 226 provide thermal stability for the radar 200 and components such as the VCO 345 and the T/R chip 230. The thermal vias 226 allow the integration of a cooling system within the radar 200. The thermal vias 226 extract heat from the T/R chip 230 and transfer it to a plurality of fins attached to a backside of the PCB 201.

Figure 3:
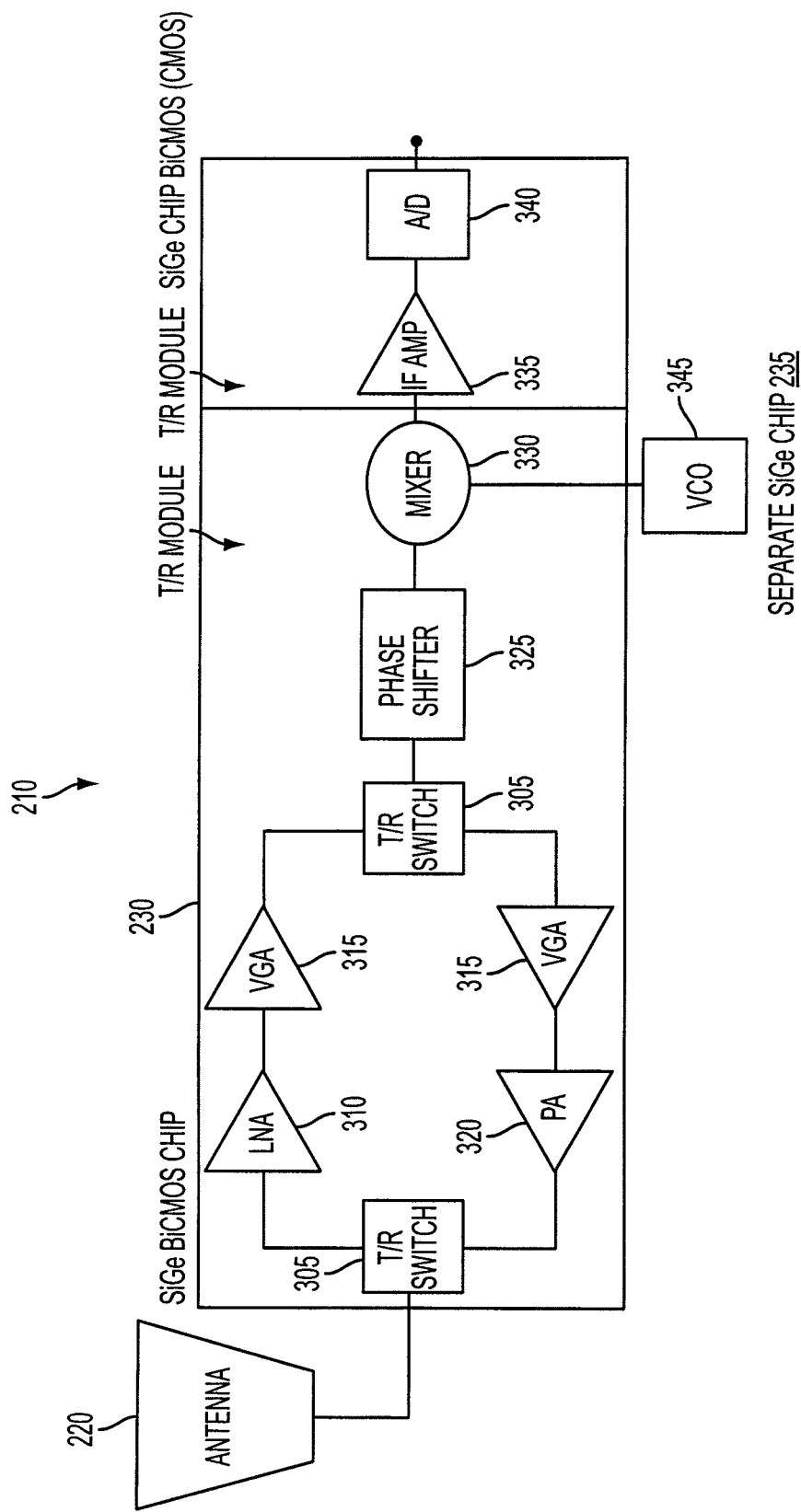
FIG. 3 is a block diagram illustrating the T/R module having two Silicon-Germanium (SiGe) BiCMOS chips according to an embodiment of the invention.

FIG. 3 is a block diagram illustrating the front end 210 having two Silicon-Germanium (SiGe) BiCMOS chips 230 and 235. The first chip 230 (e.g., a transmit/receive (T/R) monolithic microwave integrated circuit (MMIC)) may include one or more T/R switches 305, a low noise amplifier (LNA) 310, one or more variable gain amplifiers (VGA) 315, a power amplifier (PA) 320, a phase shifter 325, a mixer 330, an intermediate frequency (IF) amplifier 335, and an analog-to-digital (A/D) converter 340. The first chip 230 allows the radar 200 to operate in multiple modes and achieve very accurate beam steering and adaptive beam forming. The IF amplifier 335 and the A/D converter 340 may be implemented on a CMOS technology while the remaining components may be implemented on either a SiGe or a CMOS technology. Each antenna 220 is connected to a T/R chip 230. The second chip 235 may include a voltage controlled oscillator (VCO) 345. The two chips 230 and 235 may be combined as one chip using SiGe BiCMOS and CMOS technologies. In an alternative embodiment, the VCO chip 235 can be integrated on the first chip 230. When the VCO chip 235 is integrated on the first chip 230, good noise cancellation (grounding vias, split grounds, and packaging) is implemented. Additional low frequency and/or digital components (e.g., a digital signal processor, oscillators, PLL, digital clock, temperature control module, microprocessor, DLL, etc.) are embedded within the printed circuit board (PCB) substrate 201.

Referring to FIGS. 2D and 3, each antenna 220 may be printed on the top of and interconnected to a T/R chip 230, which may be self-packaged within the architecture. The T/R chip 230 is flip chip bonded on the substrate 205 and wirebonds 215 are used for dc biasing. Vias 226, 245 are used for transitioning the mixed signals (e.g., RF, IF, digital, DC, etc.) through the various layers of the substrate 205 and for achieving RF grounding, suppressing substrate modes, and eliminating crosstalk and parasitic noise.

The multi-layer substrate 205 allows for the reduction in the number of necessary transitions between the antenna 220 and the LNA to a maximum of 2. The first transition is from the antenna 220 to a microstrip line 245 and the second transition is a wirebond or a flip-chip connection 250 to the LNA. The antenna array 220 can be created using waveguides or microstrips. Therefore, using waveguides, the first transition is from a waveguide to a microstrip. The second transition is a vertical transition through the multi-layer substrate 205. The flip-chip transition provides significantly less parasitic inductance and lower loss compared to prior art wirebonds. Hence, the radar 200 reduces the loss between the antenna 220 and the first stage of the receiver (e.g., LNA), which significantly improves the overall noise and sensitivity of the radar 200.

Figure 4:
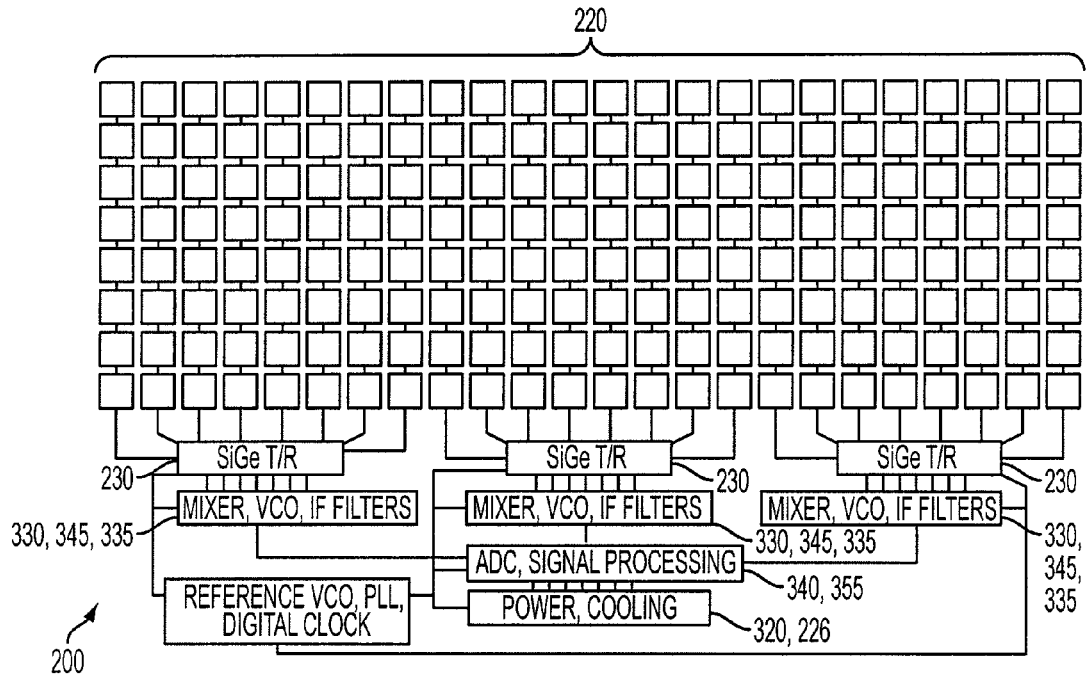
FIG. 4 is a block diagram illustrating the radar according to an embodiment of the invention.

FIG. 4 is a block diagram illustrating the radar 200. Each T/R chip 230 may send signals to an array of antennas 220. For example, each T/R chip 230 is shown to control an 8×8 array of antennas 220. Each channel can function as both a transmitter and a receiver. In one embodiment, the radar 200 has 9 channels where each channel can be used as a transmit and receive channel. The radar 200 can be covered with a corrective dielectric lens (or a metamaterials lens) that can be used to correct the antenna beam by reducing the side lobe level and package the front end 210. The corrective lens can be made from conventional dielectric materials or meta-materials for optimum performance.

Figure 5:
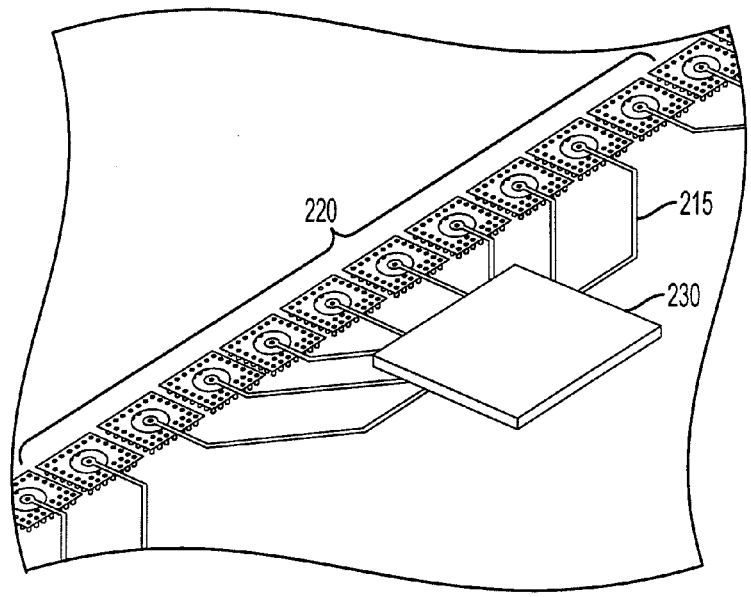
FIG. 5 is a perspective view of a T/R chip connected to an array of antennas using vertical transitions (vias) according to an embodiment of the invention.

The radar 200 may include a signal processing module 355 that controls the operations and functions of the various components of the radar 200. The signal processing module 355 can independently change each antenna 220 between short-range and long-range depending on the number of channels being used, the gain of the antenna array, and the road conditions. FIG. 5 is a perspective view of a T/R chip 230 connected to an array of antennas 220 using vias 215. In one embodiment, the array of antennas 220 is comprised of microstrip patch antennas. All the antennas, through a microstrip-based distribution network, are connected to the T/R chip 230.

Figure 6:
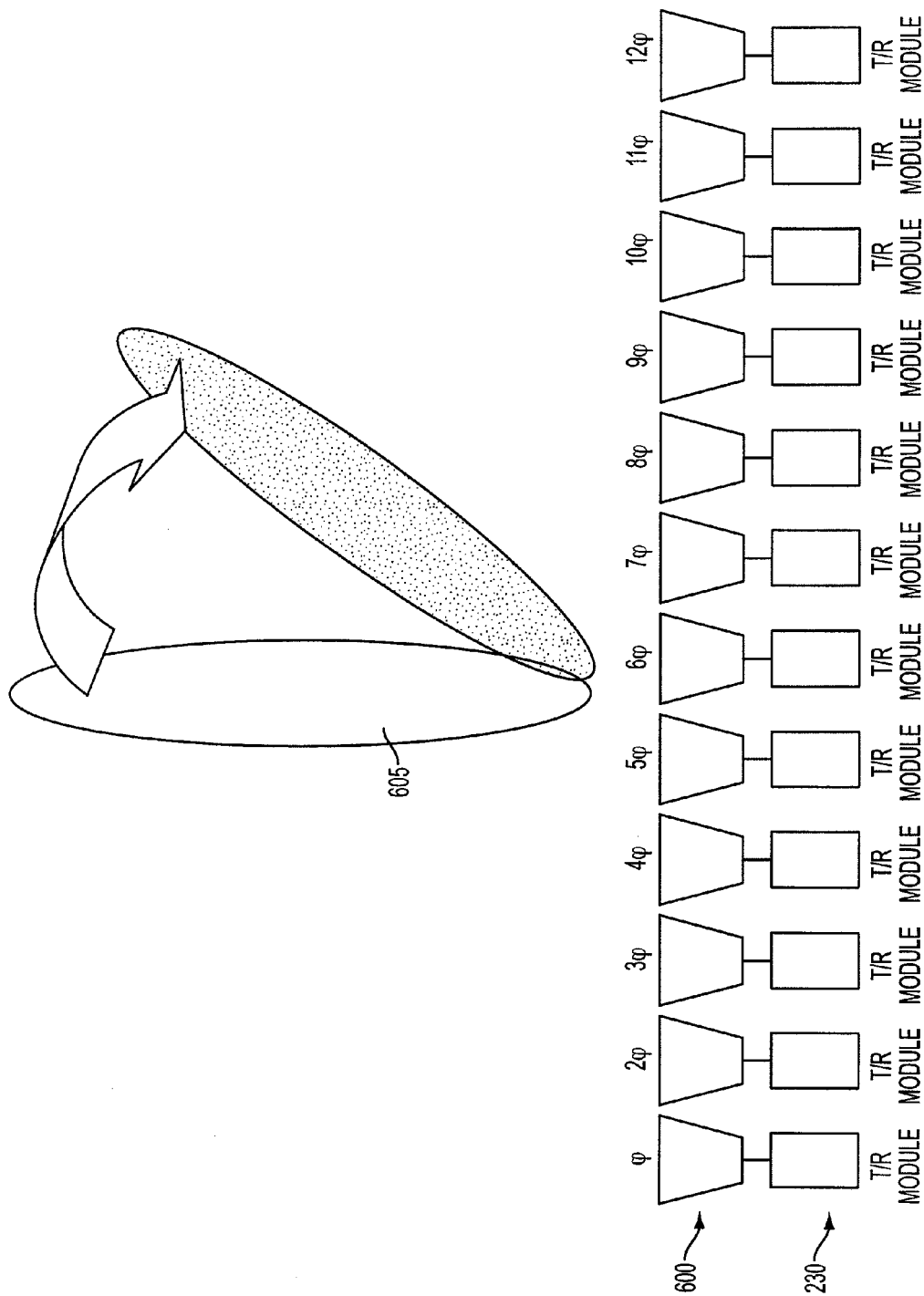
FIG. 6 is a block diagram illustrating antennas and T/R chips according to an embodiment of the invention.

FIG. 6 is a block diagram illustrating T/R chips 230, antennas 600, and beams 605 that are produced or scanned depending on the added phase delay from the phase shifters 325. The VGA 315 can taper the amplitude in order to reduce the side lobe level during scanning. The radar 200 can achieve beam steering by adding phase delay on each antenna 220 through the beams 605 or by sequential lobing (i.e., switching channels on and off). The radar 200 can use adaptive beam forming algorithms (e.g., adaptive nulling) for the removal of strong interfering signals from adjacent noise sources or vehicles.

Figure 7:
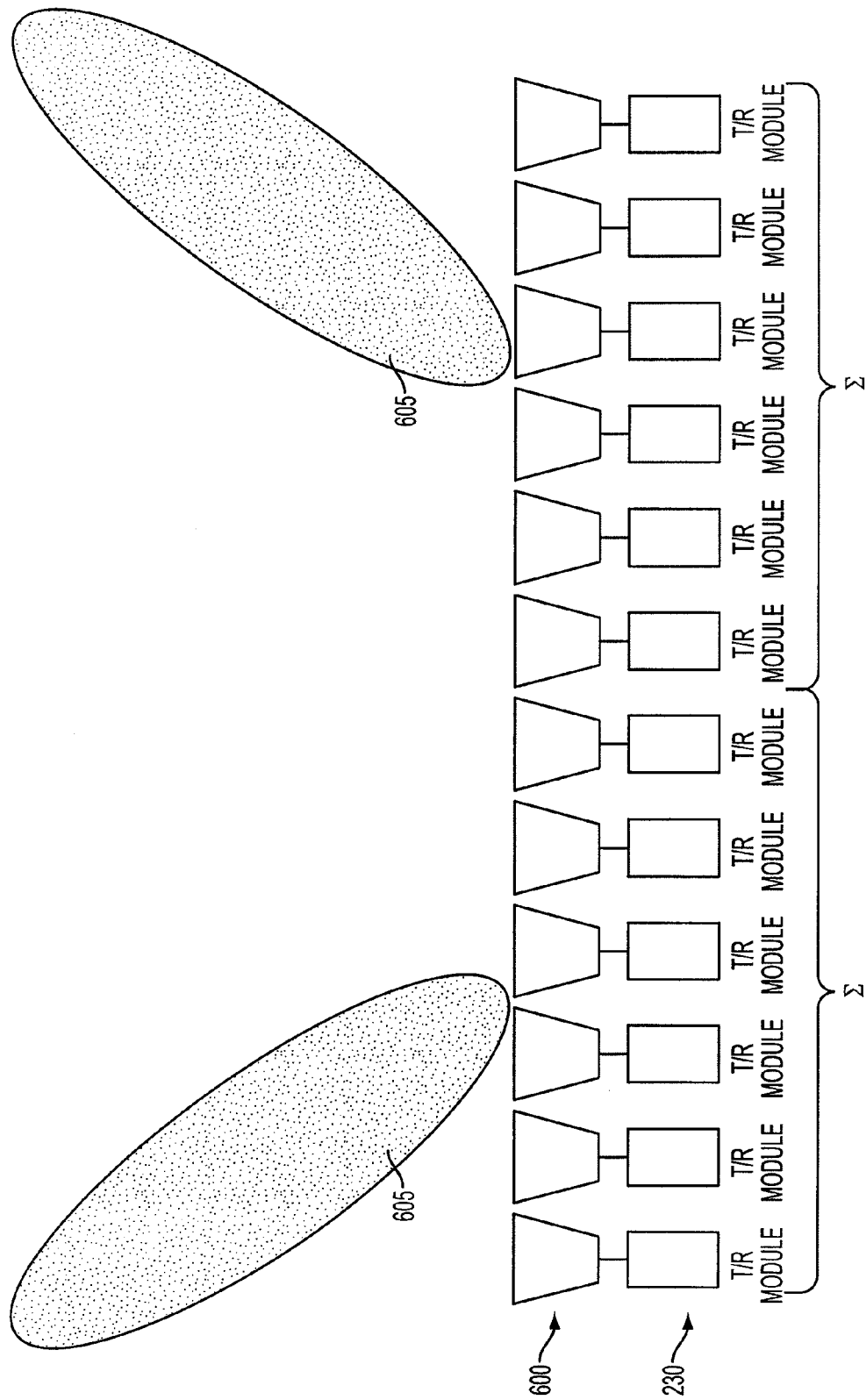
FIG. 7 is a block diagram illustrating antennas and T/R chips according to an embodiment of the invention.

FIG. 7 is a block diagram illustrating T/R chips 230, antennas 600, and multiple beams 605 that can be formed and steered independently. The signal to each antenna can be combined to form multiple beams. As shown, the first six signals are combined to form a first beam and the second six signals are combined to form a second beam. The summation and/or difference of the signals can be performed in the digital domain after the A/D converter 340 and therefore different combinations of signals (i.e., beams) can be combined to form multiple beams. Independently steering multiple beams can be used to independently track multiple targets.

Figure 8:
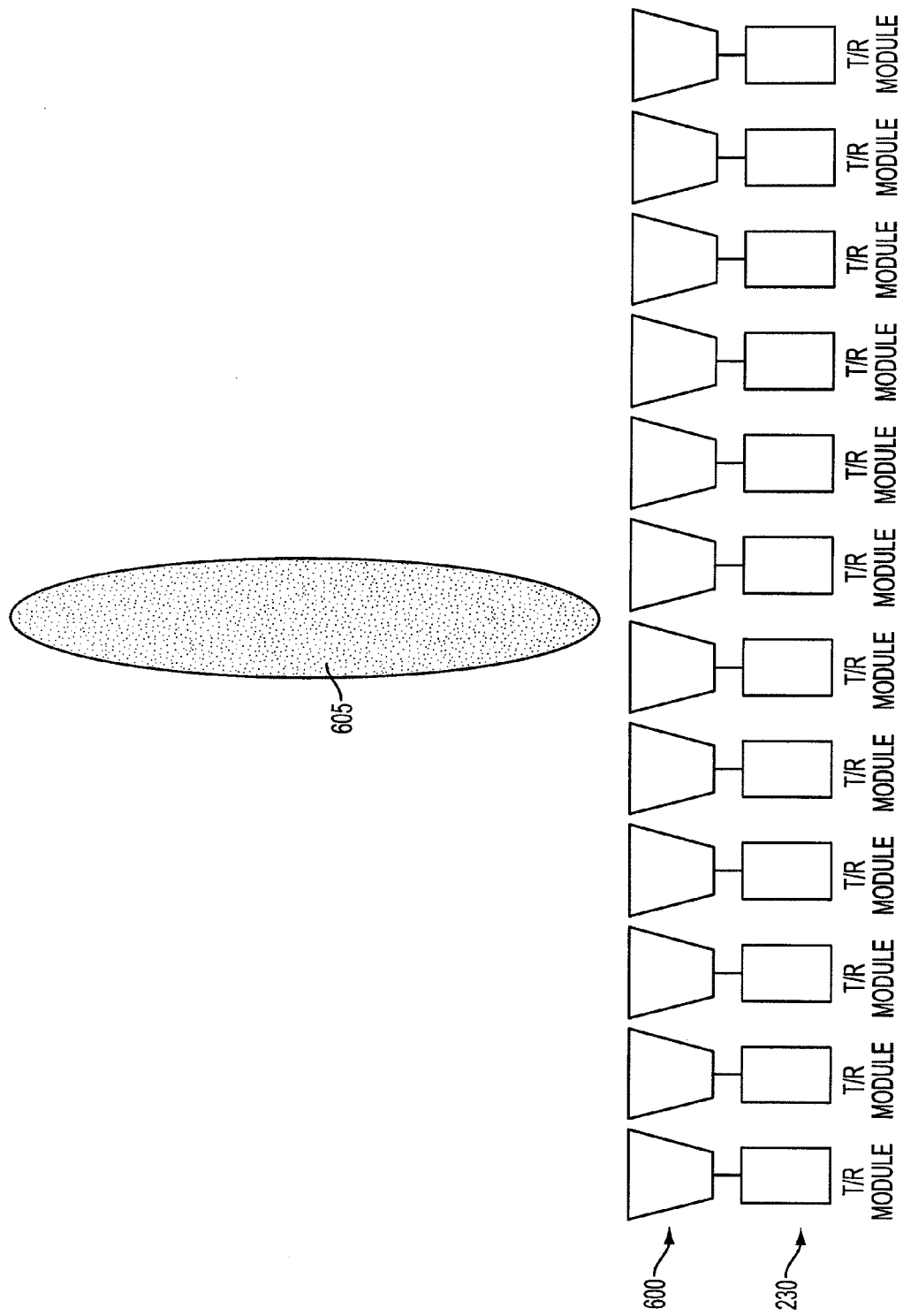
FIG. 8 is a block diagram illustrating antennas and T/R chips where narrow beams can be formed by a high gain antenna array for long range radar when all of the T/R chips are on and transmitting or receiving according to an embodiment of the invention.

FIG. 8 is a block diagram illustrating T/R chips 230, antennas 600, and narrow beam 605 that can be formed by a high gain antenna array for long range radar when all of the T/R chips 230 are on and transmitting or receiving.

Figure 9:
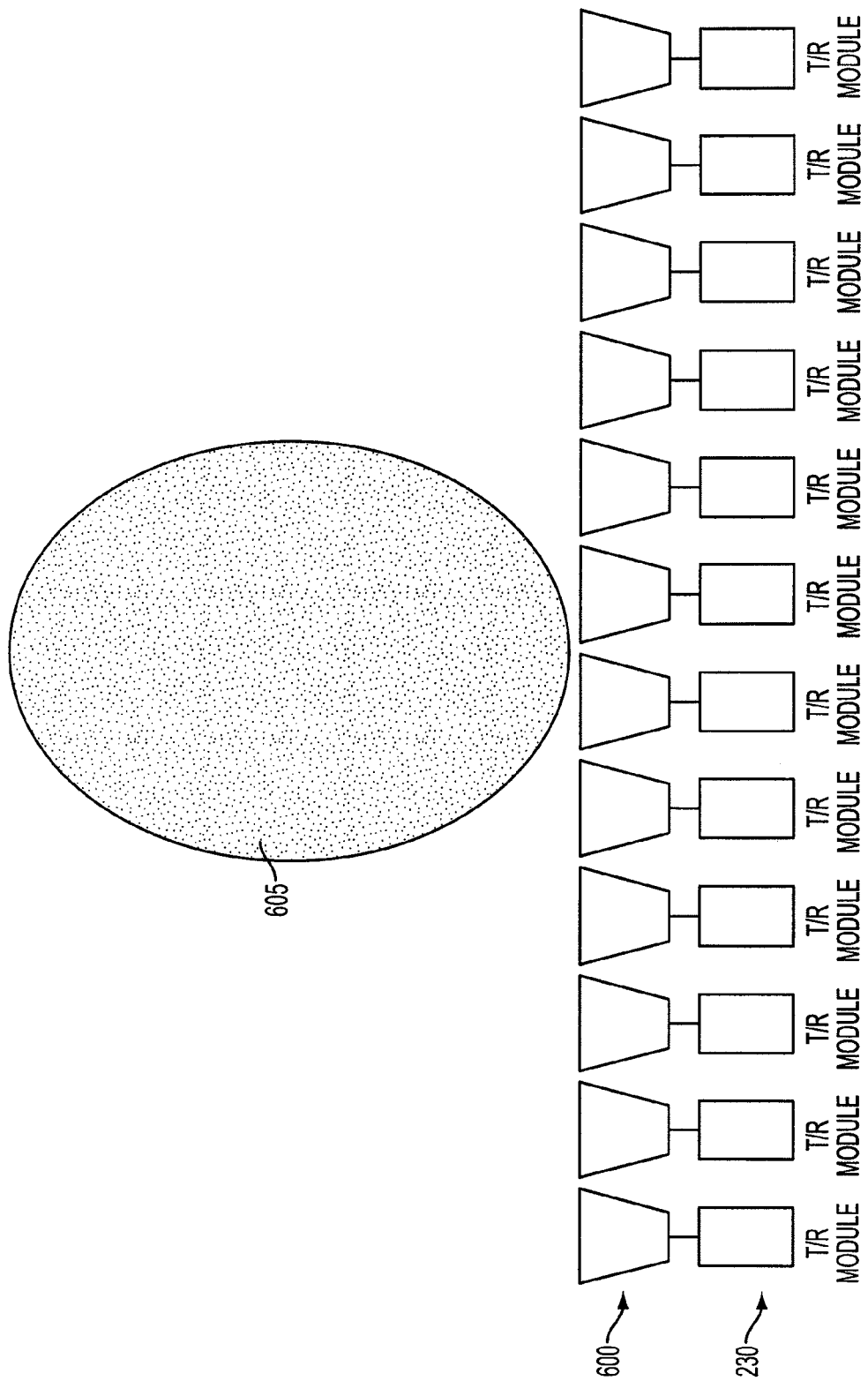
FIG. 9 is a block diagram illustrating antennas and T/R chips where wide beams can be formed by a low gain antenna array for short range radar when some of the T/R chips are on and transmitting or receiving according to an embodiment of the invention.

FIG. 9 is a block diagram illustrating T/R chips 230, antennas 600, and wide beam 605 that can be formed by a low gain antenna array for short range radar when some of the T/R chips 230 are on and transmitting or receiving.

Figure 10:
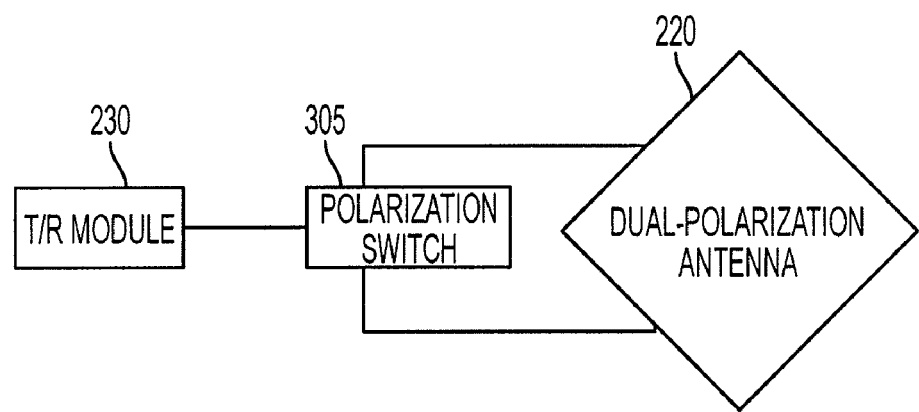
FIG. 10 is a portion of a block diagram illustrating T/R chip, a polarization switch, and a dual polarization antenna which can be used to form polarimetric radars according to an embodiment of the invention.

FIG. 10 is a portion of a block diagram illustrating T/R chip 230, a polarization switch 305, and a dual polarization antenna 220 which can be used to form polarimetric radars. The T/R chip 230 and one or more polarization switches 305 can be used to provide polarization diversity (i.e., generate two orthogonal linearly polarized signals). The signals are the basis for polarimetric radars. A polarization antenna, a horn, or a circularly polarized antenna can be used. These radars offer improved detection in clutter, capability of detecting targets with lower radar cross section, and ability to detect the condition on the road (e.g., ice, mud, debris, etc.). FIG. 10 can be implemented as part of FIG. 3.

FIG. 11 is a cross-sectional view of a front end of a radar where the planar antenna array 220 shown in FIG. 2D is replaced with a waveguide horn array 221 fabricated on a low-cost metallized plastic 290. The waveguide horn array 221 and the low-cost metallized plastic 290 may be mounted on the substrate 205. The plastic material is used to both form the metallized waveguides and to package the T/R chip 230. The metallized plastic 290 can also act as the interposer of the antennas 220. Furthermore, the waveguide horn array 221 can be dielectrically loaded for reducing side lobe level as well as for providing a self-packaged radar component.

Figure 12:
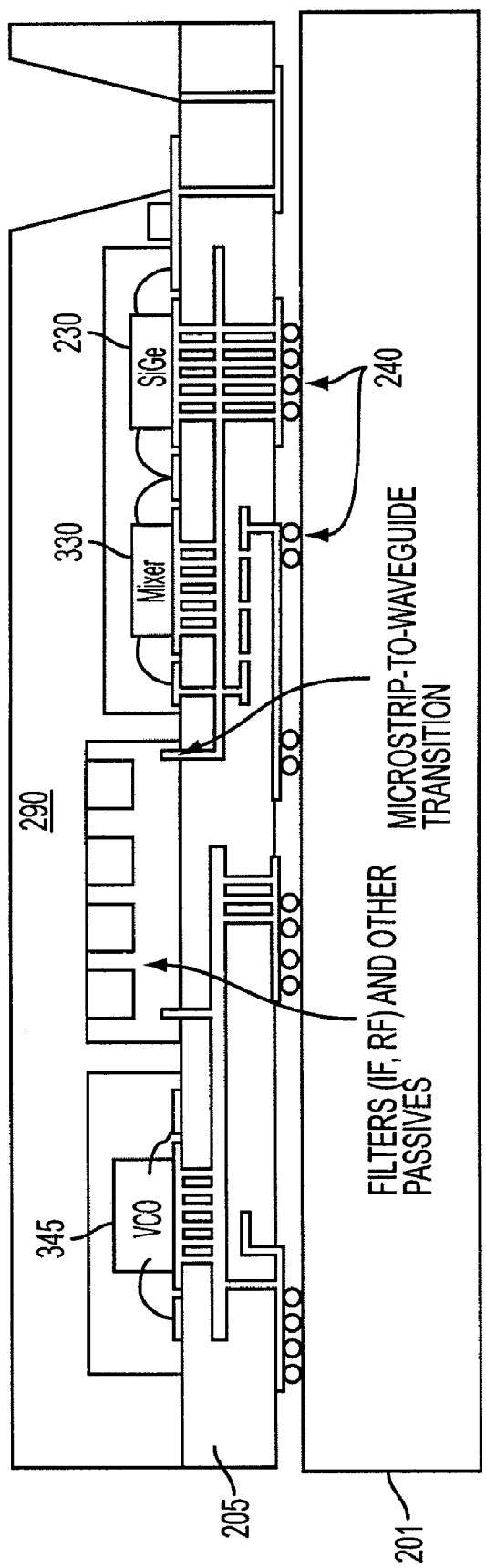
FIG. 12 is a cross-sectional view of a front end of a radar where some passive circuits (filters, diplexers or resonators) are integrated within the metallized low-cost plastic according to another embodiment of the invention.

FIG. 12 is a cross-sectional view of an alternative embodiment of the radar. Passive components (e.g., filters, diplexers, resonators, and switches) can be manufactured on the metallized plastic 290. Resonant filters can provide RF and IF filtering as well as reduce the leakage of the Tx signal to the Rx signal for FMCW radars. Diplexers can be used for transmission and reception signal separation. Medium Q (e.g., 500-1000) resonators can be used in the oscillators. Switches with tunable filters may be provided for isolating the Rx signal from a high power transmitted signal. The feeding of the passive components can be done through the use of a probe or a coupling shot.

In some embodiments of the invention, an apparatus for forming and independently steering beams is disclosed.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An automotive radar comprising:
a printed circuit board having a digital signal processor mounted thereon; and
a multi-layer substrate mounted on the printed circuit board, the multi-layer substrate having a plurality of antennas and a transmit/receive module directly connected to the plurality of antennas, wherein the transmit/receive module receives signals from the digital signal processor and uses the signals to form a plurality of beams that are transmitted using the plurality of antennas.

2. The automotive radar of claim 1 wherein the multi-layer substrate is selected from a group consisting of a liquid crystal polymer, a low temperature cofired ceramic, a Parylene-N dielectric, a PTFE ceramic, and a PTFE glass fiber material.

3. The automotive radar of claim 1 wherein the plurality of antennas and the transmit/receive module are part of the multi-layer substrate.

4. The automotive radar of claim 1 wherein at least one of the plurality of antennas is a waveguide horn made out of a metallized plastic.

5. The automotive radar of claim 1 wherein at least one of the plurality of antennas is a dual polarization antenna.

6. The automotive radar of claim 1 wherein the plurality of antennas are a planar microstrip antenna array fed through a microstrip distribution network.

7. The automotive radar of claim 1 further comprising a thermal via attached to the transmit/receive module for removing heat from the transmit/receive module.

8. The automotive radar of claim 1 further comprising a micro-machined plastic mounted over the transmit/receive module.

9. The automotive radar of claim 1 wherein the transmit/receive module is a transmitter and a receiver.

10. The automotive radar of claim 1 wherein the transmit/receive module includes a plurality of transmit/receive chips where each chip is connected to at least one of the plurality of antennas.

11. The automotive radar of claim 1 further comprising a variable gain amplifier to modify beams from the plurality of antennas.

12. The automotive radar of claim 1 further comprising a phase shifter to scan an antenna beam by adding a progressive phase delay.

13. The automotive radar of claim 1 further comprising an analog-to-digital converter to digitize the signals and to create multiple independent beams that can be steered to track multiple targets.

14. The automotive radar of claim 1 wherein the transmit/receive module generates and receives at least two orthogonal polarizations.

15. The automotive radar of claim 14 further comprising a voltage controlled oscillator integrated on the SiGe BiCMOS chip and ground vias and split grounding planes to isolate noise created by the voltage controlled oscillator.

16. The automotive radar of claim 1 wherein the transmit/receive module is selected from a group consisting of a SiGe BiCMOS chip and an all silicon CMOS chip.

17. The automotive radar of claim 1 further comprising a voltage controlled oscillator chip encapsulated into a metallized housing made out of an organic substrate to shield noise.

18. The automotive radar of claim 1 further comprising a corrective lens or a metamaterials lens positioned on the plurality of antennas to reduce side lobe levels.

19. An automotive radar comprising:
a printed circuit board having an analog-to-digital converter; and
a multi-layer substrate mounted on the printed circuit board, the multi-layer substrate having microstrip patch antennas that receive and transmit beams, a transmit/receive chip connected to the microstrip patch antennas and the analog-to-digital converter, and a phase shifter connected to the analog-to-digital converter to add phase delay to the beams.

20. An automotive radar comprising:
a printed circuit board;
a multi-layer substrate mounted on the printed circuit board, the multi-layer substrate having a plurality of antennas and a SiGe BiCMOS chip directly connected to the plurality of antennas, wherein the SiGe BiCMOS chip is configured to achieve adaptive beam control and beam steering of the plurality of antennas;
a micro-machined plastic mounted over the transmit/receive module; and
a voltage controlled oscillator integrated on the SiGe BiCMOS chip and ground vias and split grounding planes to isolate noise created by the voltage controlled oscillator.

21. The automotive radar of claim 20 wherein the micro-machined plastic is a metallized plastic for creating a plurality of passive components, and wherein the plurality of passive components is selected from a group consisting of a waveguide distribution network, a filter, a diplexer, a resonator, a coupler, and combinations thereof.

* * * * *